United States Patent
Rossi

(10) Patent No.: US 7,005,628 B2
(45) Date of Patent: Feb. 28, 2006

(54) AMPLIFIER WITH VARIABLE SIGNAL GAIN AND MATCHED GAIN BANDWIDTH

(75) Inventor: Giuseppe Rossi, Pasadena, CA (US)

(73) Assignee: Micron Technology, Inc., Boise, ID (US)

( * ) Notice: Subject to any disclaimer, the term of this patent is extended or adjusted under 35 U.S.C. 154(b) by 116 days.

(21) Appl. No.: 09/975,324

(22) Filed: Oct. 10, 2001

(65) Prior Publication Data

US 2002/0166948 A1 Nov. 14, 2002

Related U.S. Application Data

(60) Provisional application No. 60/285,431, filed on Apr. 19, 2001.

(51) Int. Cl.
*H01J 40/14* (2006.01)
(52) U.S. Cl. ............................. 250/214 A; 250/208.1; 330/308; 348/300
(58) Field of Classification Search ............ 250/214 A, 250/214 AG, 208.1; 330/127; 348/300–308, 348/294, 229.1
See application file for complete search history.

(56) References Cited

U.S. PATENT DOCUMENTS

| | | | | | |
|---|---|---|---|---|---|
| 4,415,803 | A | * | 11/1983 | Muoi | ..................... 250/214 A |
| 5,012,202 | A | * | 4/1991 | Taylor | ......................... 330/284 |
| 5,495,201 | A | * | 2/1996 | Alini et al. | .................. 327/563 |
| 5,668,501 | A | * | 9/1997 | Venes | ......................... 330/254 |
| 5,864,416 | A | * | 1/1999 | Williams | .................... 359/189 |
| 5,892,540 | A | * | 4/1999 | Kozlowski et al. | ......... 348/300 |
| 5,905,256 | A | * | 5/1999 | Nakano | .................. 250/214 A |
| 6,081,558 | A | * | 6/2000 | North | .......................... 375/316 |
| 6,137,533 | A | * | 10/2000 | Azim | ...................... 348/222.1 |
| 6,661,457 | B1 | * | 12/2003 | Mathur et al. | ............. 348/273 |
| 6,707,492 | B1 | * | 3/2004 | Itani | ....................... 348/229.1 |

\* cited by examiner

*Primary Examiner*—David Porta
*Assistant Examiner*—Stephen Yam
(74) *Attorney, Agent, or Firm*—Dickstein Shapiro Morin & Oshinsky LLP

(57) ABSTRACT

A sensor includes a gain stage with a differential amplifier with an adjustable gain. The differential amplifier may change its gain in response to the magnitude of a signal readout from the pixel array. The differential amplifier includes an input transistor with an adjustable transconductance. A transconductance controller can change the bias currents supplied to one or more sets of parallel transistors in the input transistor and consequently change the transconductance, and power consumption, of the input transistor. The transconductance controller can select a transconductance setting that is associated with a selected gain setting in order to more efficiently match the power consumption of the amplifier to its gain.

26 Claims, 6 Drawing Sheets

AMPLIFIER WITH VARIABLE SIGNAL GAIN AND MATCHED GAIN BANDWIDTH

CROSS-REFERENCE TO RELATED APPLICATION

This application claims priority to U.S. Provisional Application Ser. No. 60/285,431 filed on Apr. 19, 2001.

BACKGROUND

Active pixel sensor (APS) imaging devices are described in U.S. Pat. No. 5,471,515. These imaging devices include an array of pixel cells, arranged in rows and columns, that convert light energy into electric signals. Each pixel includes a photodetector and one or more active transistors. The transistors typically provide amplification, readout control and reset control, in addition to producing the electric signal output from the cell.

The pixels generate analog signals, which are converted into digital signals by analog-to-digital converters (ADCs) for further processing. The analog signal read-out chain may include a gain stage to amplify the analog signals into a range suitable for the ADCs. The magnitude of the gain may range from unity to about eight.

During readout, the amplifier provides adjustable signal gain with a given amplifier accuracy. The amplifier accuracy determines the required amplifier settling time, i.e., the interval between the application of the input voltage step and the point at which the output signal reaches and stays within a given error band.

In many sensors, the unity gain frequency of the amplifier is selected to satisfy the settling time requirement for the worst-case condition, i.e., the maximum signal gain. While this design approach ensures that the amplifier is complying with the settling time requirement at any signal gain selection, it only optimizes the amplifier power consumption in the unique case of the worst-case (maximum) gain setting. For any gain setting lower than the maximum gain setting, the amplifier draws more power than is necessary for the required settling time.

SUMMARY

A sensor includes a pixel array, a read-out stage, and a gain stage that includes a differential amplifier with an adjustable gain. The differential amplifier may change its gain in response to the magnitude of a signal readout from the pixel array. The differential amplifier includes an input transistor with an adjustable transconductance. The transconductance of the input transistor is proportional to the power consumption of the input transistor. The input transistor includes two or more sets or parallel transistors, each set connected to a different bias current supply. A transconductance controller can change the bias currents supplied to one or more sets of parallel transistors and consequently change the transconductance, and power consumption, of the input transistor. The transconductance controller can select a transconductance setting that is associated with a selected gain setting in order to more efficiently match the power consumption of the amplifier to its gain.

DETAILED DESCRIPTION

Figure 1:
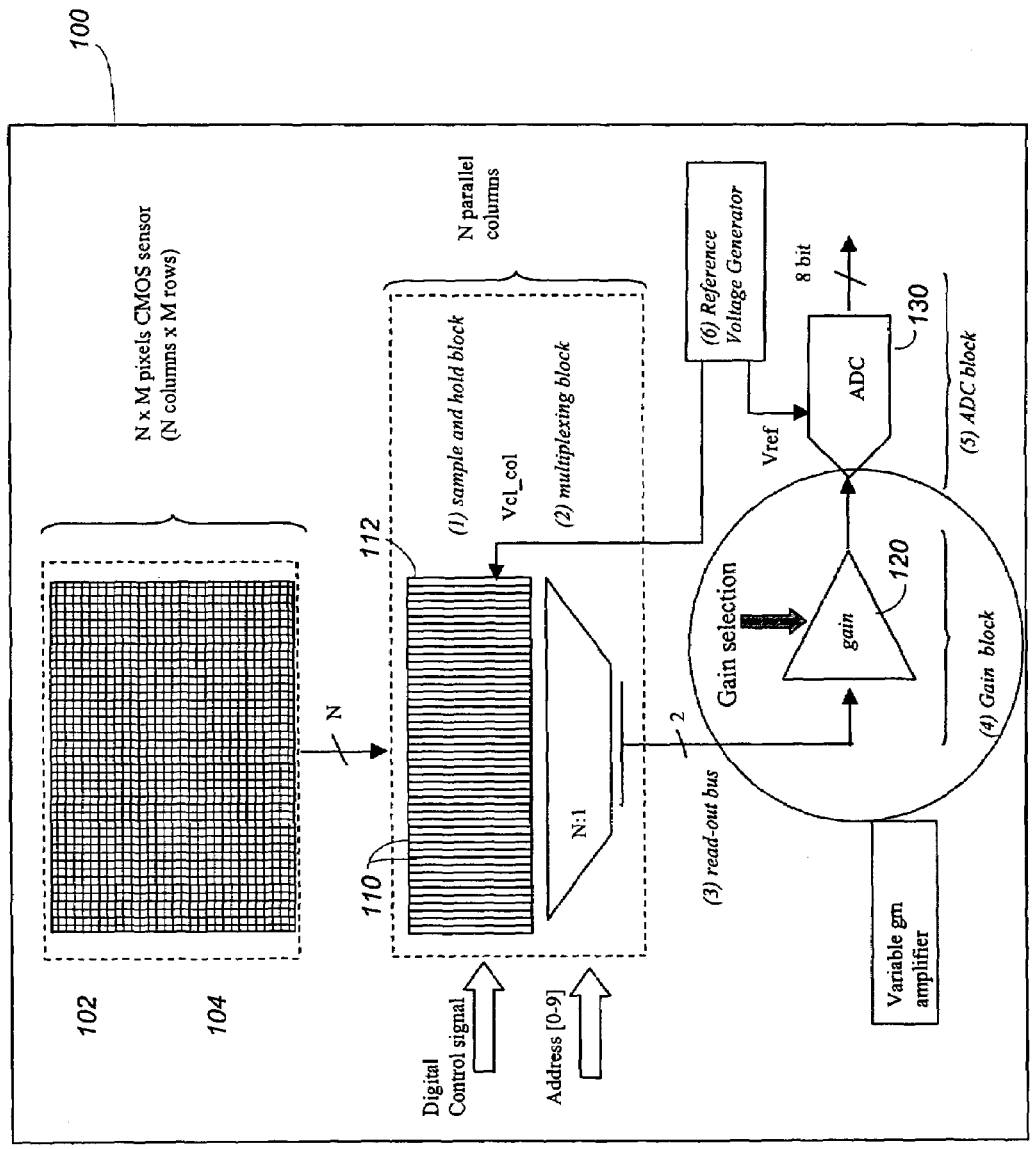
FIG. 1 is a block diagram of a sensor according to an embodiment.

A sensor 100 according to an embodiment includes a pixel array 102. The sensor 100 may be an active pixel sensor (APS), in which the pixel array includes a grid of individually addressable pixels 104 arranged in rows and columns. Each pixel 104 includes a photodetector, such as a photogate, photodiode, or pinned photodiode. The photodetector converts light energy received in the form of photons into an electric charge. This electric charge corresponds to an amount of light that the pixel 104 receives during an exposure to an image. The amount of light received by each pixel in the array during exposure to the image is used by the sensor 100 to produce a signal indicating a corresponding digital image.

After the exposure and a subsequent integration period, the pixel array 102 is read out row-by-row for processing. The electric charge held in the pixel in each column in the selected row is output to a sample-and-hold (S/H) unit 110 in a S/H block 112. The S/H unit 110 may include a sampling switch and a holding capacitor to store the sampled analog signal.

The sampled analog signals are passed from the S/H block 112 to a gain stage 120 before being sent to analog-to-digital converters (ADCs) in an ADC block 130 for conversion to digital signals. The ADCs may have a range of analog signals they can convert into discrete digital values. The analog signals generated by pixels exposed to very low levels of light may fall below the lower limit of this range. The gain stage 120 selects an appropriate gain setting to amplify such small analog signals to values that are within a suitable range for the ADCs. The gain stage 120 may have, for example, a minimum gain setting of 1 and a maximum gain setting of 8.

Figure 2:
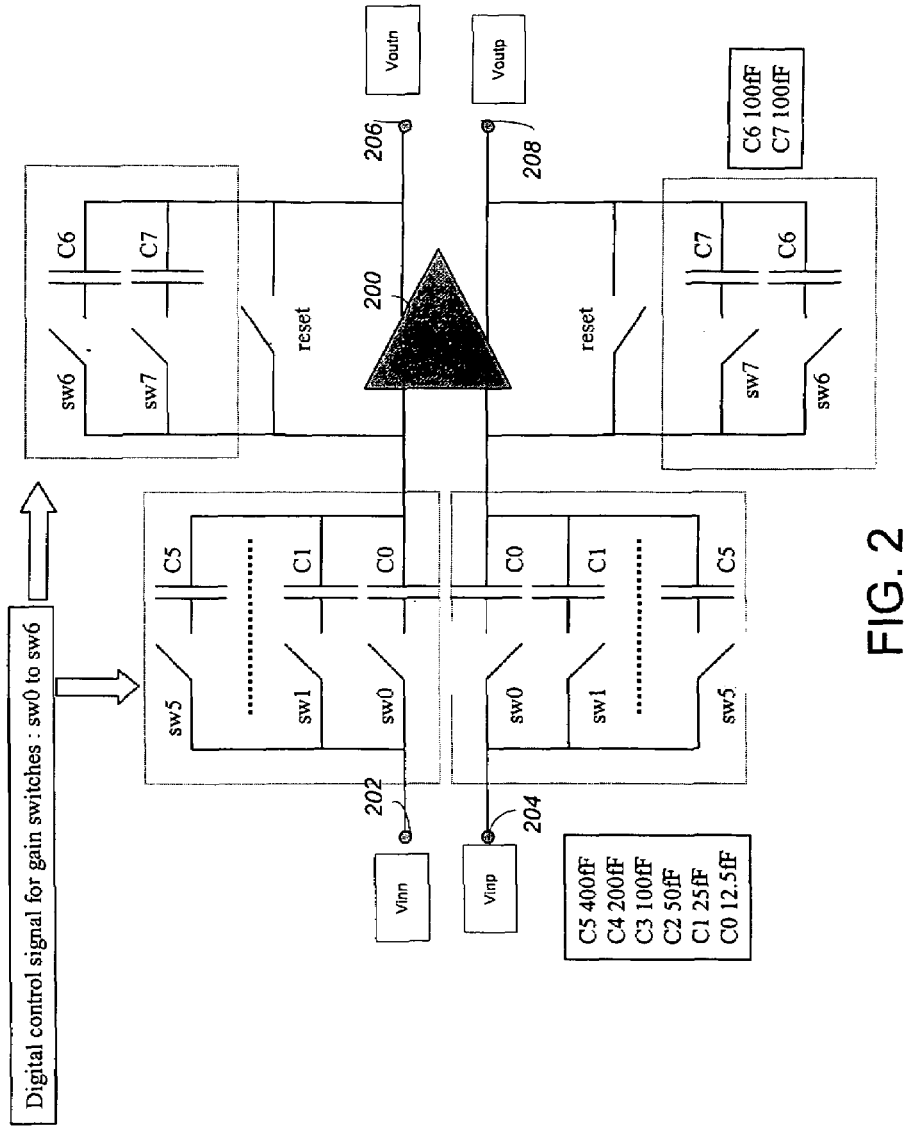
FIG. 2 is a schematic diagram of a differential amplifier with variable gain according to an embodiment.

The gain stage 120 may include a class A differential amplifier 200 with variable gain, as shown in FIG. 2. The differential amplifier 200 has two input nodes 202, 204. The input voltages $Vin_n$ and $Vin_p$ applied to these nodes are equal in amplitude and 180° out of phase. The differential amplifier also has two output nodes 206, 208. The output voltages $Vout_n$ and $Vout_p$ are equal in amplitude and 180° out of phase.

The gain provided by the differential amplifier 200 may be adjusted by selecting an input capacitance and a feedback capacitance. The input capacitance may be set by selectively opening and closing switches $sw_0$–$sw_5$, and the feedback capacitance may be set by selectively opening and closing switches $sw_6$–$sw_7$. Each switch $sw_0$–$sw_7$ is coupled to an associated capacitor $C_0$–$C_7$. Exemplary values for $C_0$–$C_7$ are 12.5 fF, 25 fF, 50 fF, 100 fF, 200 Ff, 400 fF, 100 fF, and 100 fF, respectively. The ratio of the input capacitance to the output capacitance determines the gain setting.

The power consumed by the amplifier increases with its gain bandwidth (GBW). The GBW of the amplifier is proportional to the transconductance ($g_m$) of the input transistors in the amplifier, and is given by $$\frac{gm}{2\pi C},$$

where C is the load capacitance. Since the transconductance is proportional to the bias current of the input transistor, the GBW may be varied by changing the bias current of the input transistor.

Figure 3:
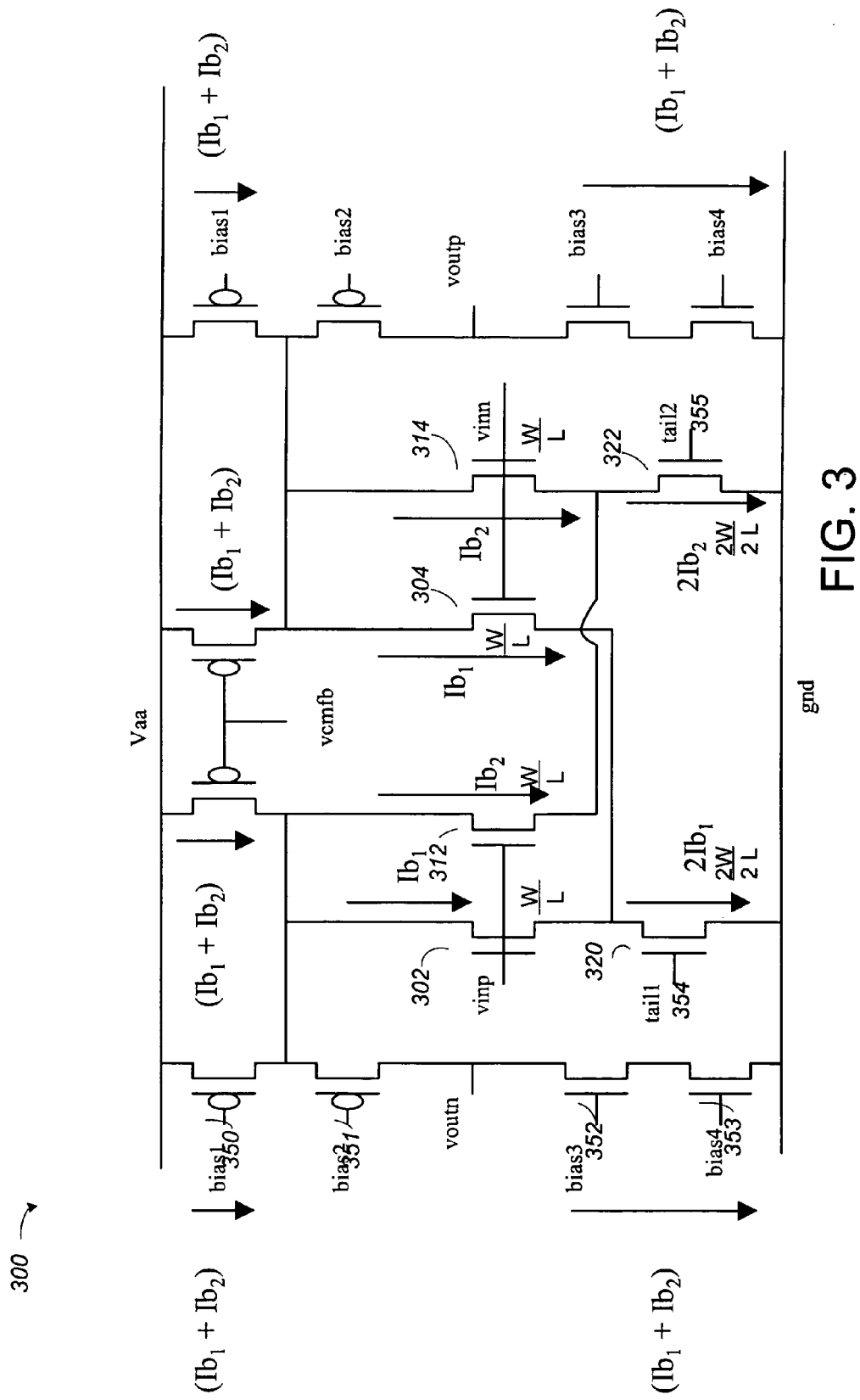
FIG. 3 is a schematic diagram of the differential amplifier of FIG. 2 in greater detail.

FIG. 3 illustrates a differential amplifier 300 with variable gain and a variable GBW, which may be selected in response to the selected gain in order to increase the efficiency of the amplifier. Rather than having two input transistors for $Vin_n$ and $Vin_p$, respectively, the input transistors are segmented into two sets of input transistors 302, 304 and 312, 314. Each set of transistors is connected in parallel. The bias current through the set of parallel transistors 302, 304 is controlled by bias transistor 320 with input terminal $tail_1$. The bias current through the set of parallel transistors 312, 314 is controlled by bias transistor 322 with input terminal $tail_2$.

The total bias current input to the differential amplifier 300 is $2Ib_1+2Ib_2$. The bias transistors 320, 322 form current mirrors. Each bias transistor controls the bias current through the two parallel transistors to which it is connected. The $tail_1$ bias transistor 320 sets the portion of the bias current flowing through each of the parallel transistors 302, 304 to $Ib_1$, and the $tail_2$ bias transistor 322 sets the portion of the bias current flowing through each of the parallel transistors 312, 314 to $Ib_2$.

The input transconductance, $g_m$, and hence the GBW and power consumption, of the amplifier may be varied by varying the bias current through one or both sets of parallel transistors ($Ib_1$ and/or $Ib_2$). In an embodiment, the bias current applied to terminal $tail_2$ is reduced for lower gain settings. When the bias current $Ib_2$ gets close to the operating threshold for the parallel transistors 312, 314, i.e., the current at which the transistors begin to turn off, the bias current applied to terminal $tail_1$ may then be reduced to further lower the transconductance at the input of the differential amplifier 300.

Figure 4:
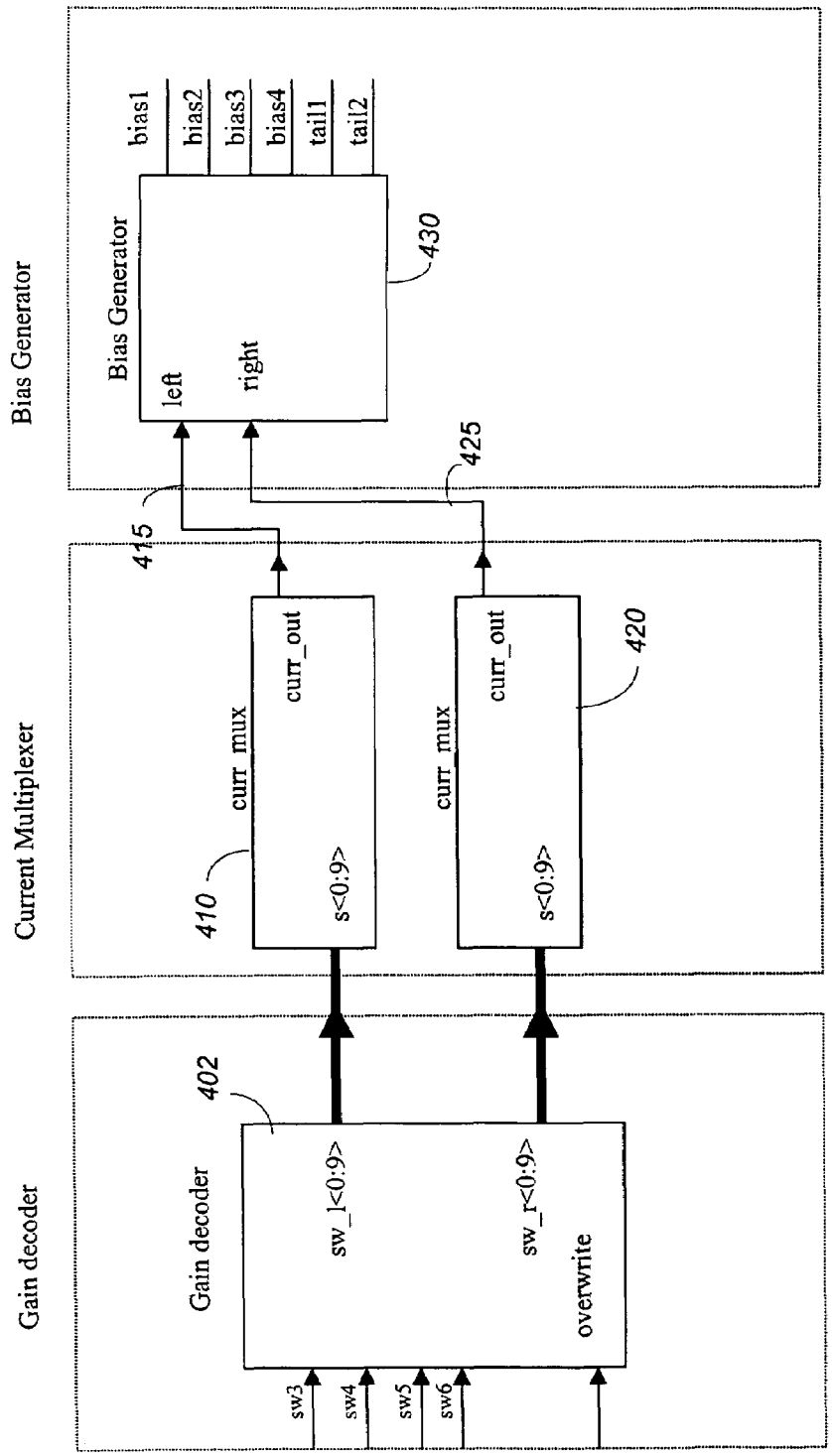
FIG. 4 is a block diagram of a bias current selection and generation circuit according to an embodiment.
Figure 5:
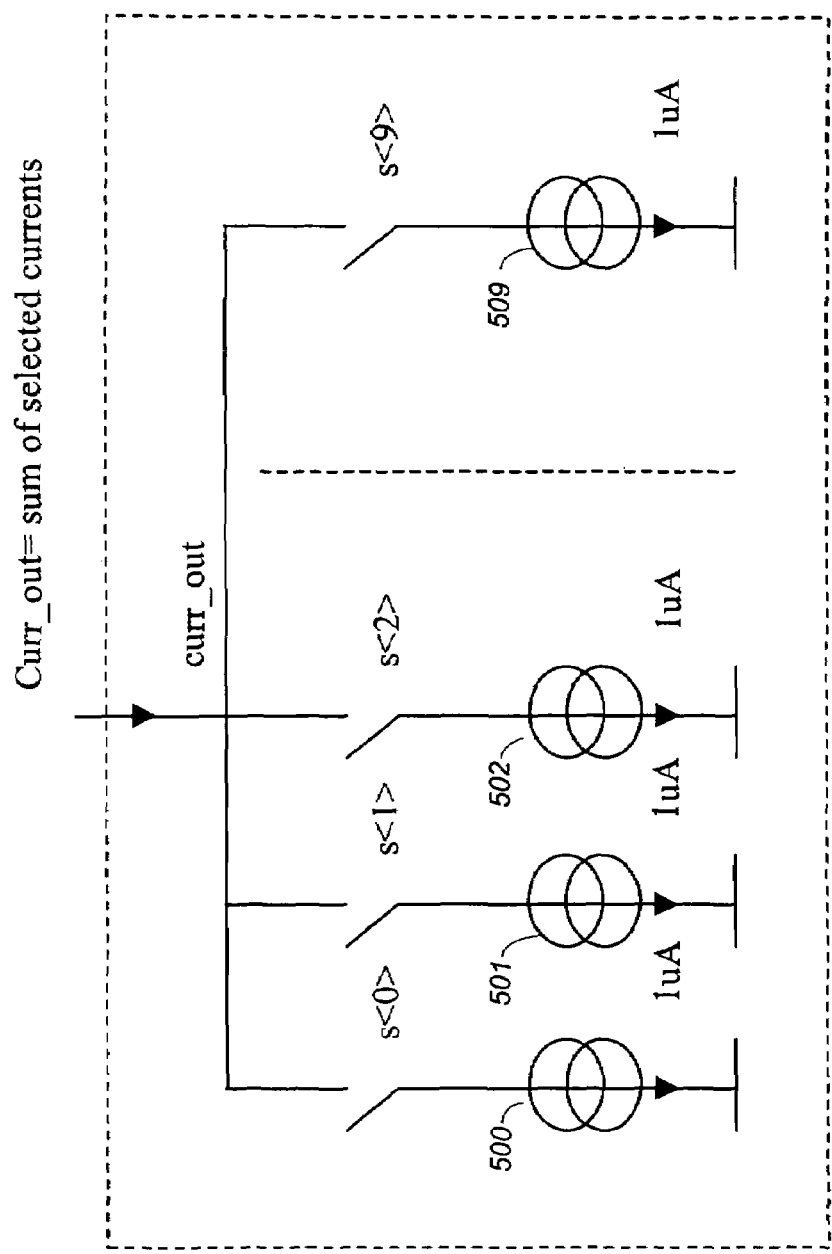
FIG. 5 is a schematic diagram of a current multiplexer according to an embodiment.

As shown in FIG. 4, a gain decoder 402 selects a bias current setting in response to the gain setting. The gain decoder 402 controls two current multiplexers 410, 420. Each current multiplexer may include an array of ten 1 $\mu$A current sources 500–509, as shown in FIG. 5. Each current source 500–509 may be selected by closing a corresponding control switch s<0>–s<9>. The total current output by a current multiplexer depends on the number of control switches selected by the gain decoder 402.

Figure 6:
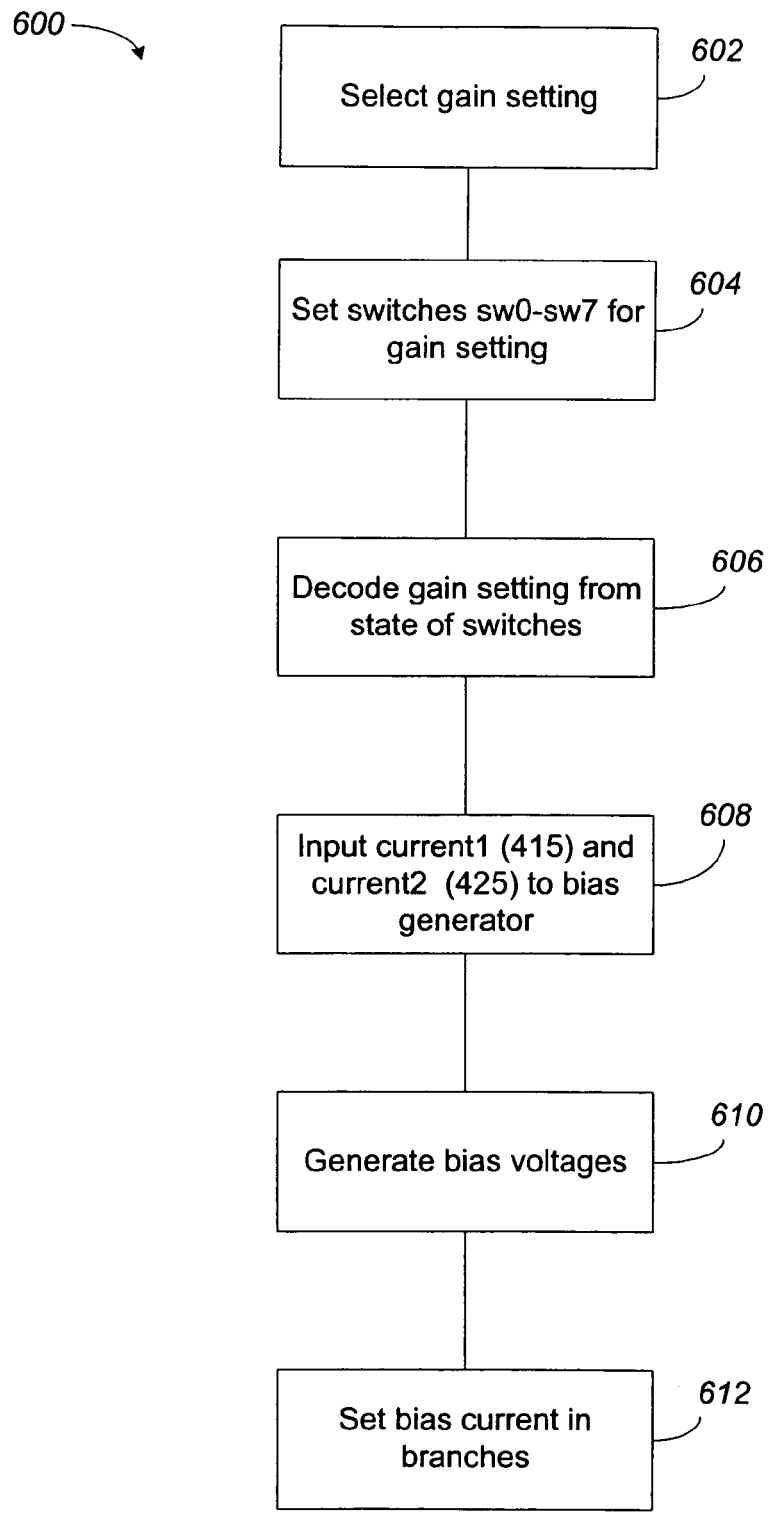
FIG. 6 is a flowchart describing an operation for matching a current bias to a selected gain value according to an embodiment.

The currents 415, 425 output from the current multiplexers 410, 420 are input to a bias generator 430. The bias generator 430 uses these currents to generate bias voltages in response to the selected gain setting and applies the bias voltages to terminals 350–355 (for $bias_1$, $bias_2$, $bias_3$, $bias_4$, $tail_1$, and $tail_2$, respectively). FIG. 6 is a schematic diagram of a bias generator circuit 600 according to an embodiment.

In an embodiment, the differential amplifier 300 may have three bias current settings; HIGH, MED, and LOW. The gain decoder 402 may decode these three settings from the states of switches $sw_3$–$sw_6$. A HIGH setting corresponds to a gain between 6 and 8, a MED setting corresponds to a gain between 3 and 6, and a LOW setting corresponds to a gain between 1 and 3. For the HIGH setting, all switches for both current multiplexers 410, 420 are closed, providing 100% of the available bias current. For the MED setting, all switches in the current multiplexer 410 are closed, and switches s<0> and s<1> are closed in the current multiplexer 420, providing 60% of the available bias current. For the LOW setting, switches s<0> to s<3> are closed in the current multiplexer 410, and all switches are open in the current multiplexer 420, providing 20% of the available bias current.

FIG. 6 illustrates a flowchart describing a bias selection and generation operation 600 according to an embodiment. The flow of the operation 600 is exemplary, and blocks in the flowchart may be skipped or performed in different order according to alternate embodiments.

A gain setting is selected (block 602) in response to the amplitude of the analog signal output from a pixel in a selected row. The switches $sw_0$–$sw_7$ are selectively opened and closed to produce the selected the gain setting (block 604). For example, in the present embodiment, a gain of 1 is produced when all switches but switch $sw_7$ are open, a gain of about 4 is produced when all switches are closed, and a gain of about 8 is produces when all switches but $sw_6$ are closed.

The gain decoder determines the bias current setting (HIGH, MED, or LOW) from the state of switches $sw_3$–$sw_6$ (block 606). The gain decoder controls the current multiplexers 410, 420 to generate the current appropriate for the gain setting and input the currents to the bias generator (block 608). The bias generator generates the appropriate bias voltages for terminals 350–355 ($bias_1$, $bias_2$, $bias_3$, $bias_4$, $tail_1$, and $tail_2$) (block 610) and sets the bias current in the bias transistors 320, 322 appropriate for the gain setting (block 612).

In alternate embodiments, the input transistors may be split into more than two sets of parallel input transistors, each with an associated bias transistor. This may provide more precise tuning of the bias current to the various gain settings. Each gain setting may be associated with a distinct bias current setting to optimize power consumption in the amplifier for that gain setting.

With more sets of parallel input transistors, the bias current may be reduced in one set until the input transistors in that set begin to turn off, at which point the bias current in another set may be reduced. The use of multiple sets of parallel input transistors may enable greater tuning of the bias current settings to the various gain settings.

It may be desirable to provide a minimum amount of bias current through all input transistors to prevent the input transistors from turning completely OFF, which may produce unpredictable behavior in the amplifier.

An advantage of matching the GBW to a selected signal gain may be reduced power consumption of the amplifier. Another advantage may be reduced root mean square (RMS) voltage noise at the output of the amplifier. The total RMS voltage noise at the output of the amplifier may be proportional to the root square of the amplifier's GBW. For a selected signal gain, matching the GBW to the signal gain selects the lowest GBW value for a given settling time requirement. This may produce less noise at the amplifier output compared to an amplifier that is designed for the worst-case gain setting (i.e., with no GBW matching to the selected signal gain).

A number of embodiments have been described. Nevertheless, it will be understood that various modifications may be made without departing from the spirit and scope of the invention. Accordingly, other embodiments are within the scope of the following claims.

The invention claimed is:

1. A method of controlling gain in a pixel array comprising:
changing the gain of an amplifier in a gain stage of a sensor in response to a signal read out from a pixel array in the sensor, wherein said gain stage is in an output path to an analog to digital converter for readout; and
changing the power consumption of the amplifier in the gain stage in response to changing the gain, wherein said changing the power consumption comprises changing a transconductance of at least one input transistor in the amplifier.

2. The method of claim 1, wherein said changing the power consumption comprises:
decreasing the power consumption in response to a decrease in the gain; and
increasing the power consumption in response to an increase in the gain.

3. The method of claim 1, further comprising:
associating a plurality of power consumption settings with a plurality of gain settings;
selecting a gain setting from said plurality of gain settings; and
selecting a power consumption setting associated with the selected gain setting.

4. The method of claim 3, wherein the gain setting is selected from eight gain settings.

5. The method of claim 4, wherein the power consumption setting is selected from three power consumption settings, each of three power consumption settings being associated with a different plurality of gain settings.

6. The method of claim 3, wherein each of the plurality of gain settings is associated with a different one of the plurality of power consumption settings.

7. A method of controlling gain in a pixel array comprising:
selecting one of a plurality of gain settings in response to a signal read out from a pixel array in a sensor;
generating two or more bias currents having bias current values associated with the selected gain setting; and
applying said two or more bias currents to a plurality of sets of two parallel transistors in an amplifier in a gain stage of the sensor in order to change the input transconductance of the amplifier, wherein said gain stage is in an output path to an analog to digital converter for readout.

8. The method of claim 7, further comprising associating each of a plurality of input transconductance settings to a plurality of gain settings, each input transconductance setting being associated with a given set of bias current values.

9. The method of claim 7, further comprising associating an input transconductance setting to each of a plurality of gain settings, each input transconductance setting being associated with a given set of bias current values.

10. The method of claim 7, further comprising applying a minimum amount of bias current to all transistors for preventing the transistors from turning off.

11. The method of claim 7, further comprising controlling each set of two parallel transistors by a respective terminal tail bias.

12. An apparatus comprising:
a gain stage for a sensor of an active pixel sensor array, wherein said gain stage is in an output path to an analog to digital converter for readout and said gain stage having a differential amplifier providing gain by adjusting an input capacitance and a feedback capacitance, said differential amplifier including
a gain selector operative to select one of a plurality of gain settings in response to a signal from said pixel array,
an input transistor having a variable input transconductance, and
a transconductance controller operative to select an input transconductance of the input transistor in response to a selected gain setting.

13. The apparatus of claim 12, wherein the transconductance controller is operative to select an input transconductance setting associated with the selected gain setting from a plurality of input transconductance settings.

14. The apparatus of claim 12, wherein the input transistor comprises:
a first plurality of parallel transistors connected to a first bias current supply; and
a second plurality of parallel transistors connected to a second bias current supply.

15. The apparatus of claim 14, wherein the transconductance controller comprises:
a bias current selector operative to select values for a first bias current and a second bias current associated with a selected gain setting, and
a bias current generator operative to generate a first current having the selected value for the first bias current value and apply said first current to the first bias current supply and to generate a second current having the selected value for the second bias current value and apply said second current to the second bias current supply.

16. The apparatus of claim 15, wherein each first and second bias current values produces a different input transconductance.

17. The apparatus of claim 15, wherein the bias current selector includes a plurality of switches and is operative to select a different set of switches for each of said plurality of gain settings.

18. The apparatus of claim 17, wherein the bias current selector is operative to select a set of current values in response to the switches selected by the gain selector.

19. A sensor comprising:
a pixel array comprising a plurality of pixels arranged in rows and columns;
a read-out section operative to read Out signals generated by pixels in the pixel array;
a gain stage wherein said gain stage is in an output path to an analog to digital converter for readout and said gain stage having a differential amplifier including
a gain selector operative to set the differential amplifier to one of a plurality of gain settings in response to a pixel signal read out from the pixel array,
an input transistor having an input transconductance and including a first plurality of parallel transistors connected to a first bias current supply and a second plurality of parallel transistors connected to a second bias current supply, and
a transconductance controller operative to change the transconductance of the input transistor to match a selected gain setting by selectively applying different bias currents to at least one of said first and second bias current supplies for different gain settings.

20. The sensor of claim 19, wherein the transconductance controller comprises:
a gain decoder operative to select one or more bias current values in response to a selected gain response from a plurality of bias current values; and a bias generator operative to generate and apply said one or more bias current values to at least one of the first and second bias current supplies.

21. The sensor of claim 19, wherein the transconductance controller is operative to increase the transconductance of the input transistor in response to an increase in the gain of the differential amplifier and to decrease the transconductance of the input transistor in response to a decrease in the gain of the differential amplifier.

22. The sensor of claim 19, wherein the sensor is an active pixel sensor (APS).

23. A method of controlling gain in a pixel array comprising:
changing the gain of a differential amplifier in a gain stage of a sensor in response to a signal read out from a pixel array in the sensor; and
changing a gain bandwidth (GBW) of the differential amplifier in the gain stage in response to changing the gain,
wherein said changing the GBW comprises changing a transconductance of an input transistor in the amplifier.

24. The method of claim 23, wherein said changing the GBW comprises:
decreasing the GBW in response to a decrease in the gain; and
increasing the GBW in response to an increase in the gain.

25. The method of claim 23, further comprising changing the root mean square (RMS) noise at an output of the amplifier in response to changing the GBW.

26. The method of claim 25, wherein said changing the RMS noise comprises:
decreasing the RMS noise in response to a decrease in the GBW; and
increasing the RMS noise in response to an increase in the GBW.

* * * * *